(12) United States Patent
Wong et al.

(10) Patent No.: US 8,193,835 B1
(45) Date of Patent: Jun. 5, 2012

(54) CIRCUIT AND METHOD FOR SWITCHING VOLTAGE

(75) Inventors: Yanyi Liu Wong, Seattle, WA (US); Rebecca Shiu Yun Cheng, Redmond, WA (US)

(73) Assignee: Synopsys Inc., Mountain View, CA (US)

( * ) Notice: Subject to any disclaimer, the term of this patent is extended or adjusted under 35 U.S.C. 154(b) by 142 days.

(21) Appl. No.: 12/716,287

(22) Filed: Mar. 3, 2010

(51) Int. Cl.
 *G01R 19/00* (2006.01)
(52) U.S. Cl. .............................. 327/52; 327/55; 327/215
(58) Field of Classification Search ................... 327/52, 327/55, 215
 See application file for complete search history.

(56) References Cited

U.S. PATENT DOCUMENTS

| | | | | |
|---|---|---|---|---|
| 4,170,741 A | * | 10/1979 | Williams | 327/55 |
| 5,699,305 A | * | 12/1997 | Kawashima | 365/190 |
| 6,157,219 A | * | 12/2000 | Okada | 327/55 |
| 7,233,171 B1 | * | 6/2007 | Shacter et al. | 327/53 |
| 7,463,013 B2 | * | 12/2008 | Plojhar | 323/315 |
| 7,656,199 B2 | * | 2/2010 | Ho | 327/66 |

* cited by examiner

*Primary Examiner* — Kenneth B. Wells
(74) *Attorney, Agent, or Firm* — Evergreen Valley Law Group, P.C.; Kanika Radhakrishnan

(57) ABSTRACT

An example of a circuit for generating high-voltage switching at an output terminal of the circuit includes a pair of n-type metal oxide semiconductor (NMOS) transistors responsive to input signals to generate a first voltage signal in a preset mode. The circuit also includes a predefined number of n-type cascode stages coupled between the output terminal and the pair of NMOS transistors to enable propagation of the first voltage signal to the output terminal. Further, the circuit includes a predefined number of p-type cascode stages coupled to the output terminal to enable propagation of the first voltage signal to an input voltage supply to the circuit. Furthermore, the circuit includes a first pair of cross-coupled p-type metal oxide semiconductor (PMOS) transistors coupled to the input voltage supply. The circuit includes a pair of PMOS transistors, coupled between the first pair of cross-coupled PMOS transistors and the p-type cascode stage.

24 Claims, 13 Drawing Sheets

CIRCUIT AND METHOD FOR SWITCHING VOLTAGE

FIELD

The present disclosure relates to high-voltage switches implemented in complementary metal oxide semiconductor (CMOS) processes.

BACKGROUND

Most of the commonly used non-volatile memory requires switches to selectively apply high voltages to specific circuit elements of the non-volatile memory. A laterally diffused metal oxide semiconductor (LDMOS) can be used in a high-voltage switch for selectively applying high voltages to the circuit elements. However, the LDMOS is a non-self-aligned and a non-foundry proven semiconductor device. Moreover, usage of the LDMOS in the high-voltage switch has certain limitations including additional design space which may increase product cost. In addition, voltage related stress and functional risks are higher in case of the high-voltage switch designed using the LDMOS. Also, the capability of the high-voltage switch with LDMOS to work with high input and output voltages is limited, for example 2× p-type metal oxide semiconductor (PMOS) drain breakdown voltage (U.S. Pat. No. 7,145,370 B2), and 3×PMOS drain breakdown voltage.

SUMMARY

An example of a circuit for generating high-voltage switching at an output terminal of the circuit includes an n-type cascode stage coupled between the output terminal and a pair of terminals through which a pair of voltage signals is applied to the n-type cascode stage, the n-type cascode stage enabling propagation of a first voltage signal to the output terminal in a preset mode in response to a third voltage signal, the pair of voltage signals comprising the first voltage signal and a second voltage signal. The circuit also includes a p-type cascode stage coupled to the output terminal to enable propagation of the first voltage signal to an input voltage supply terminal of the circuit. Further, the circuit includes a first pair of cross-coupled PMOS transistors coupled to the input voltage supply terminal and responsive to high-voltage switching at the input voltage supply terminal to generate high-voltage switching at the output terminal in a latched mode. Furthermore, the circuit includes a pair of PMOS transistors, coupled between the first pair of cross-coupled PMOS transistors and the p-type cascode stage, that is responsive to the first voltage signal to inactivate a first one of the first pair of cross-coupled PMOS transistors and activate a second one of the first pair of cross-coupled PMOS transistors in the preset mode to enable propagation of the first voltage signal to the input voltage supply terminal and is responsive to the high-voltage switching at the input voltage supply terminal and a fourth voltage signal to enable propagation of the high-voltage switching at the input voltage supply terminal to the output terminal in the latched mode in conjunction with the p-type cascode stage.

An example of a circuit for generating tri-state output includes a first p-type metal oxide semiconductor (PMOS) transistor having a source coupled to an input voltage supply terminal. The circuit also includes a second PMOS transistor having a source coupled to the input voltage supply terminal, a gate coupled to a drain of the first PMOS transistor and a drain coupled to a gate of the first PMOS transistor. Further, the circuit includes a third PMOS transistor having a source coupled to the input voltage supply terminal and a gate coupled to a drain of the second PMOS transistor. The circuit includes a first branch defining a first output terminal and coupled to the drain of the first PMOS transistor. The circuit further includes a second branch defining a second output terminal and coupled to the drain of the second PMOS transistor. In addition, the circuit includes a third branch defining a third output terminal and coupled to the drain of the third PMOS transistor, each branch includes a first n-type metal oxide semiconductor (NMOS) transistor receiving a voltage signal, a circuit of first type coupled between the first NMOS transistor and corresponding output terminal to enable generation of an output at the corresponding output terminal, a circuit of second type coupled between the corresponding output terminal and the drain of corresponding PMOS transistor to enable generation of the output at the corresponding output terminal in conjunction with the first NMOS transistor, the circuit of first type, and the corresponding PMOS transistor. The first branch generating one of 0 volts and a voltage equivalent to that at the input voltage supply terminal, the second branch generating one of 0 volts and the voltage equivalent to that at the input voltage supply terminal, and the third branch generating one of 0 volts, a high impedance (HI-Z) state and the voltage equivalent to that at the input voltage supply terminal based on the voltage signal received by the NMOS transistor of each branch wherein generating the voltage equivalent to that at the input voltage supply terminal includes high-voltage switching.

An example of a method for generating high-voltage switching at an output terminal of a circuit includes propagating a first voltage signal to the output terminal through an n-type cascode stage in response to receipt of the first voltage signal by the n-type cascode stage in a preset mode. The method also includes propagating the first voltage signal from the output terminal to an input voltage supply terminal through a p-type cascode stage, a pair of p-type metal oxide semiconductor (PMOS) transistors and a pair of cross-coupled PMOS transistors. Further, the method includes propagating high-voltage switching at the input voltage supply terminal to the output terminal in a latched mode through the p-type cascode stage, the pair of PMOS transistors and the pair of cross-coupled PMOS transistors.

DETAILED DESCRIPTION OF THE EMBODIMENTS

Figure 1:
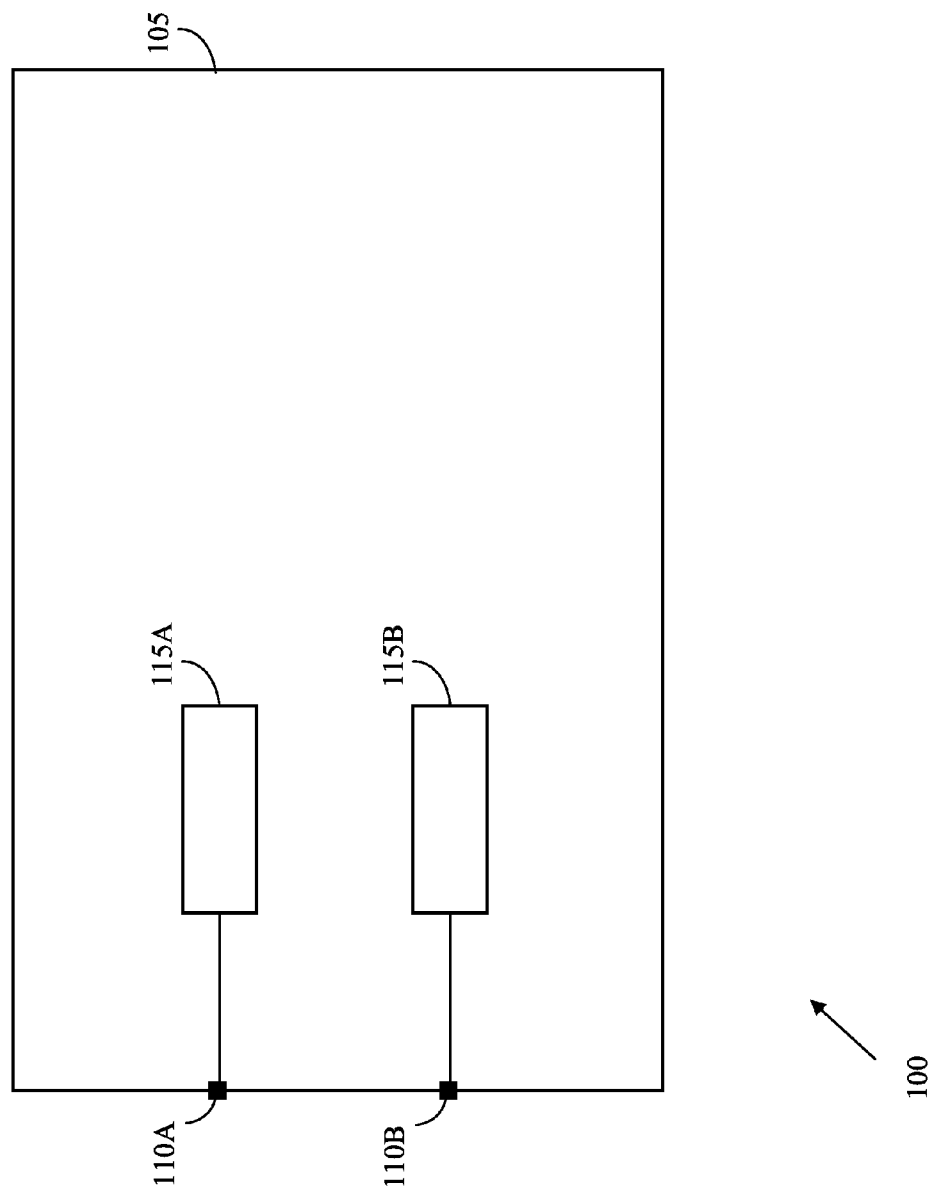
FIG. 1 exemplarily illustrates a system in accordance with one embodiment.

FIG. 1 exemplarily illustrates a system 100. The system 100 includes a non-volatile memory 105 (hereinafter referred to as the memory 105). Examples of the memory 105 include, but are not limited to, a read-only memory (ROM), and a flash memory. The memory 105 employs on-chip high-voltage switches, for example a high-voltage switching circuit 110A and a high-voltage switching circuit 110B. The high-voltage switches selectively pass high voltage to an output signal and also enable a circuit to be erased, programmed, or driven to an idle state, based on one or more logic control signals. In various embodiments, the high voltage is referred to as an input voltage supply. The one or more logic control signals are referred to as voltage signals. Examples of the voltages signals include, but are not limited to, a first voltage signal V1, a second voltage signal V2, a third voltage signal V3, a fourth voltage signal V4, and a fifth voltage signal V5.

The memory 105 includes one or more circuits, for example a circuit 115A and a circuit 115B. The circuit 115A is coupled to the high-voltage switching circuit 110A and the circuit 115B is coupled to the high-voltage switching circuit 110B.

The circuit 115A and the circuit 115B program and erase information stored on floating gates of one or more core transistors of the circuit 115A and the circuit 115B. The dimensions of the circuit 115A and the circuit 115B may be small compared with other circuits of the memory 105. The small dimensions help to accommodate large number of circuits in the small silicon area of the memory 105. The circuit 115A and the circuit 115B having small dimensions break down at high electric fields, as high gate voltages will generate high electric field: E=V/T, where E is electric field, V is high voltage and T is thickness of the dielectric. Due to the dimension limitation, the circuit 115A and the circuit 115B cannot support high voltage switching and are dependent on the high-voltage switching circuit 110A and the high-voltage switching circuit 110B. If a high-voltage switching was supported by the circuit 115A and the circuit 115B then the memory 105 is at functional risk due to the dimension limitation. Hence, the high-voltage switching circuit 110A and the high-voltage switching circuit 110B drive the circuit 115A and the circuit 115B. The high-voltage switching circuit 110A and the high-voltage switching circuit 110B selectively apply the high voltages to the circuit 115A and the circuit 115B. The high-voltage switching circuit 110A and the high-voltage switching circuit 110B can be coupled at the periphery of the memory 105 or can be coupled internally.

Figure 2:
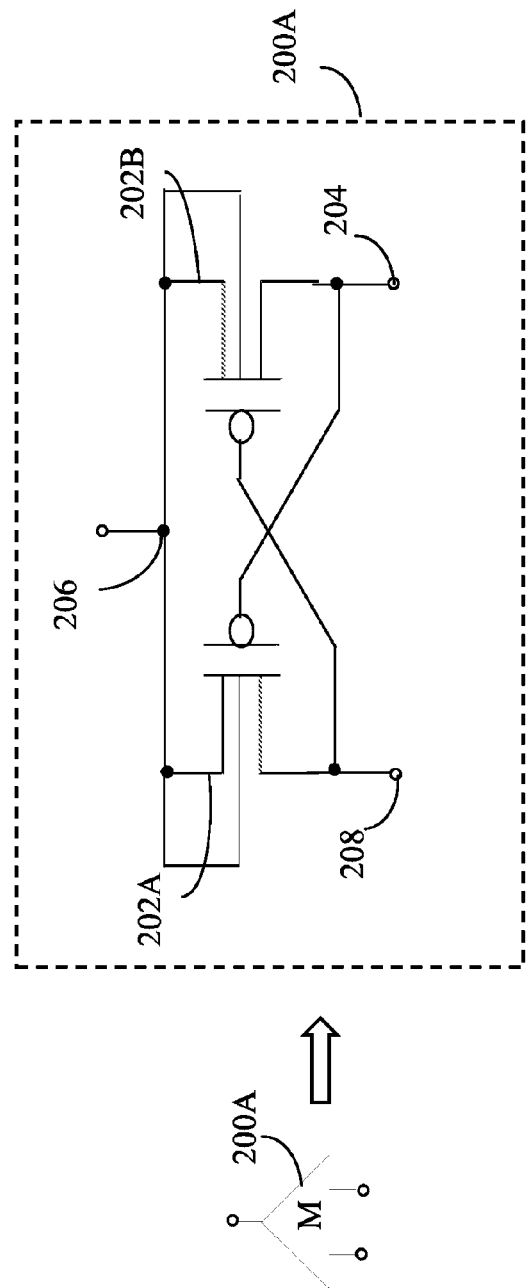
FIG. 2 illustrates a first circuit in accordance with one embodiment.
Figure 3:
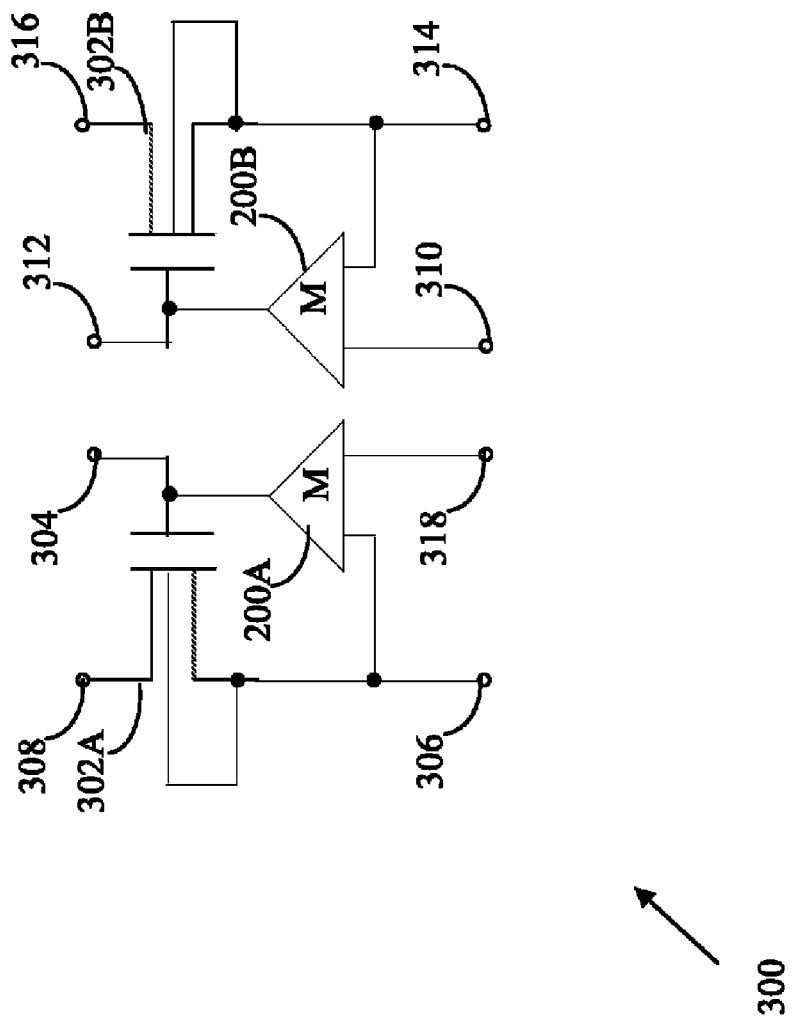
FIG. 3 illustrates an n-type cascode stage in accordance with one embodiment.

The high-voltage switching circuit 110A for driving the circuit 115A uses various elements, for example a first circuit 200A (in conjunction with FIG. 2), a second circuit 200B (having similar function and structure to the first circuit 200A), an n-type cascode stage 300 (in conjunction with FIG. 3). The high-voltage switching circuit 110A also includes a first circuit 400A (in conjunction with FIG. 4), a second circuit 400B (having similar function and structure as of the first circuit 400A), a p-type cascode stage 500 (in conjunction with FIG. 5).

FIG. 2 illustrates the first circuit 200A. The first circuit 200A includes a p-type metal oxide semiconductor (PMOS) transistor 202A having a gate coupled to an input terminal 204, a source coupled to an output terminal 206, and a drain coupled to an input terminal 208. The first circuit 200A also includes a PMOS transistor 202B having a gate coupled to the input terminal 208, a source coupled to the output terminal 206, and a drain coupled to the input terminal 204. The PMOS transistor 202A and the PMOS transistor 202B in combination can be referred to as a second pair of cross coupled PMOS transistors. The first circuit 200A outputs a maximum value of two inputs of the first circuit 200A. For example, a 2V is applied at the input terminal 204 and a 4V is applied at the input terminal 208 then the first circuit 200A outputs 4V as the maximum value at the output terminal 206.

FIG. 3 illustrates the n-type cascode stage 300. The n-type cascode stage 300 includes an n-type metal oxide semiconductor (NMOS) transistor 302A, an NMOS transistor 302B, the first circuit 200A and the second circuit 200B. The NMOS transistor 302A has a gate coupled to an output terminal 304, a source coupled to an input terminal 306, and a drain coupled an output terminal 308. The output terminal 206 is coupled to the output terminal 304, the input terminal 204 is coupled to an input terminal 318 and the input terminal 208 is coupled to the input terminal 306. The NMOS transistor 302B has a gate coupled to an output terminal 312, a source coupled to an input terminal 314 and a drain coupled to an output terminal 316. The second circuit 200B has an input terminal 310, another input terminal coupled to the input terminal 314 and an output terminal coupled to the output terminal 312. The n-type cascode stage 300 enables propagation of a first voltage signal to an output terminal of the high-voltage switching circuit 110A.

Figure 4:
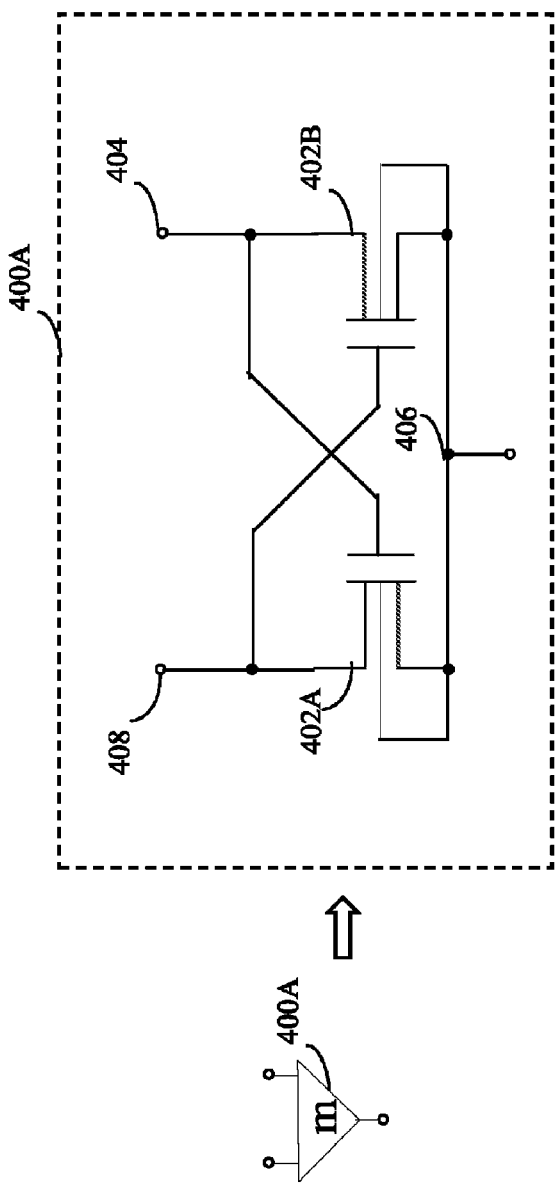
FIG. 4 illustrates a first circuit in accordance with another embodiment.

FIG. 4 illustrates the first circuit 400A. The first circuit 400A includes an NMOS transistor 402A having a gate coupled to an input terminal 404, a source coupled to an output terminal 406, and a drain coupled to an input terminal 408. The first circuit 400A also includes an NMOS transistor 402B having a gate coupled to the input terminal 408, a source coupled to the output terminal 406, and a drain coupled to the input terminal 404. The NMOS transistor 402A and the NMOS transistor 402B in combination can be referred to as a first pair of cross coupled NMOS transistors. The first circuit 400A outputs a minimum value of two inputs of the first circuit 400A. For example, a 2V is applied at the input terminal 404 and a 4V is applied at the input terminal 408 then the first circuit 400A outputs 2V as the minimum value at the output terminal 406.

Figure 5:
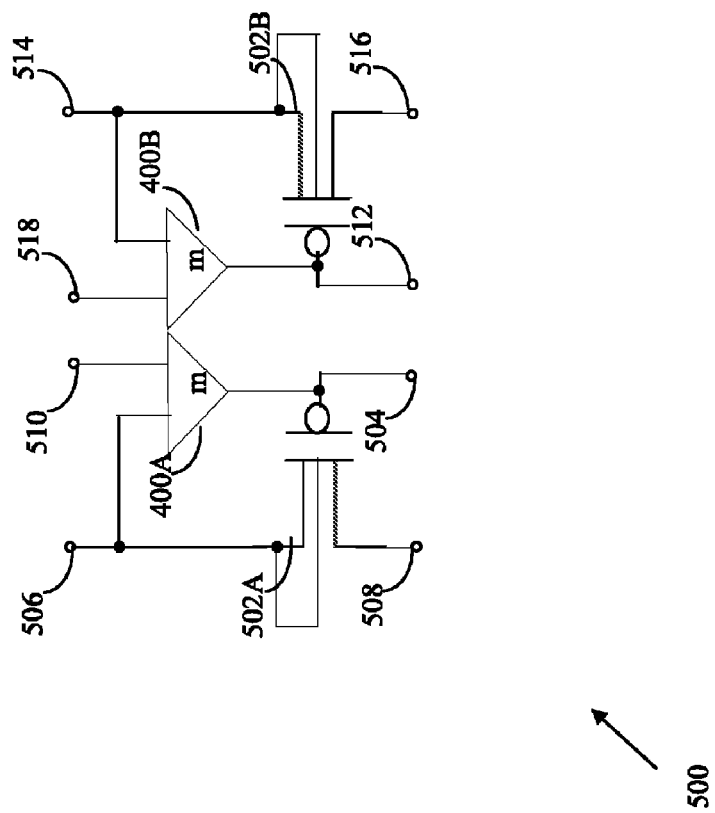
FIG. 5 illustrates a p-type cascode stage in accordance with one embodiment.

FIG. 5 illustrates the p-type cascode stage 500. The p-type cascode stage 500 includes a PMOS transistor 502A, a PMOS transistor 502B, the first circuit 400A and the second circuit 400B. The NMOS transistor 502A has a gate coupled to an output terminal 504, a source coupled to an input terminal 506, and a drain coupled to an output terminal 508. The output terminal 406 is coupled to the output terminal 504, the input terminal 404 is coupled to an input terminal 510, and the input terminal 408 is coupled to the input terminal 506. The NMOS transistor 502B has a gate coupled to an output terminal 512, a source coupled to an input terminal 514 and a drain coupled to an output terminal 516. The first circuit 400A has an input terminal 510, another input terminal coupled to the input terminal 506 and an output terminal coupled to the output terminal 504. The second circuit 400B has an input terminal 518, another input terminal coupled to the input terminal 514 and an output terminal coupled to the output terminal 512. The p-type cascode stage 500 enables propagation of the first voltage signal to the input voltage supply to the high-voltage switching circuit 110A.

Figure 6:
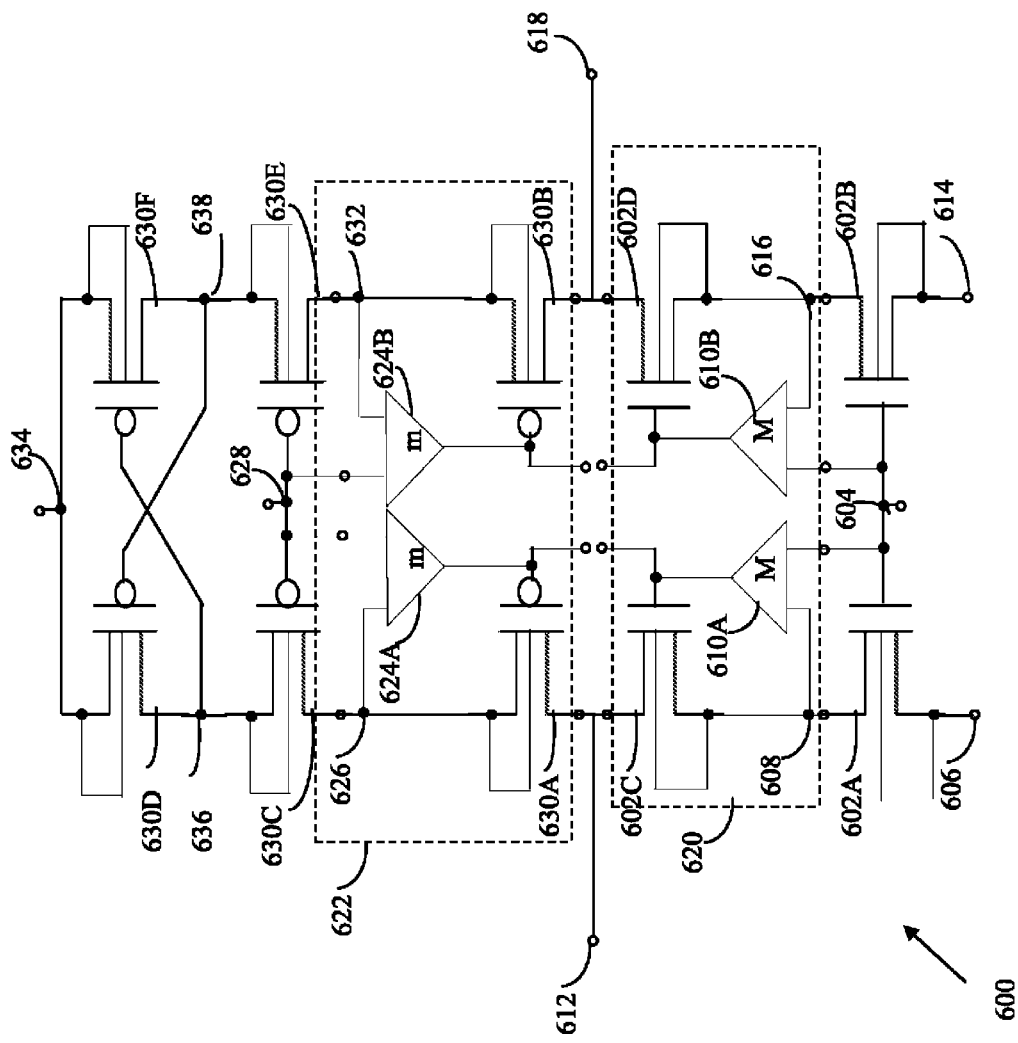
FIG. 6 illustrates a high-voltage switching circuit in accordance with one embodiment.

FIG. 6 illustrates the high-voltage switching circuit 110A (hereinafter referred to as a high-voltage switching circuit 600). The high-voltage switching circuit 600 includes an NMOS transistor 602A, and an NMOS transistor 602B. The NMOS transistor 602A and the NMOS transistor 602B can be referred to as a pair of NMOS transistors. The NMOS transistor 602A has a gate coupled to a node 604, a source coupled to a node 606, and a drain coupled to a node 608. The high-voltage switching circuit 600 includes a first circuit 610A. The first circuit 610A being similar in function and structure to the first circuit 200A. The first circuit 610A has two inputs terminals, one of the input terminals is coupled to the node 608 and the other input terminal is coupled to the node 604. An output terminal of the first circuit 610A is coupled to a gate of a first NMOS transistor 602C. The first NMOS transistor 602C has a source coupled to the node 608, and a drain coupled to an output terminal 612 of the high-voltage switching circuit 600.

The NMOS transistor 602B has a gate coupled to the node 604, a source coupled to a node 614, and a drain coupled to a node 616. The high-voltage switching circuit 600 also includes a second circuit 610B. The second circuit 610B is similar in structure and function to the first circuit 610A. The second circuit 610B has two input terminals. One of the input terminals is coupled to the node 616 and the other input terminal is coupled to the node 604. An output terminal of the second circuit 610B is coupled to a gate of a second NMOS transistor 602D. The second NMOS transistor 602D has a source coupled to the node 616, and a drain coupled to an output terminal 618 of the high-voltage switching circuit 600.

The first circuit 610A, the second circuit 610B, the first NMOS transistor 602C, and the second NMOS transistor 602D in combination form an n-type cascode stage 620. The n-type cascode stage 620 is similar in structure and function to the n-type cascode stage 300.

The second circuit 610B includes a third pair of cross coupled PMOS transistors.

The high-voltage switching circuit 600 also includes a p-type cascode stage 622. The p-type cascode stage 622 is similar in structure and function to the p-type cascode stage 500.

The p-type cascode stage 622 includes a first circuit 624A. The first circuit 624A is similar in structure and function to the first circuit 400A. The first circuit 624A has two inputs terminals, one of the input terminals is coupled to a node 626 and the other input terminal is coupled to a node 628. An output terminal of the first circuit 624A is coupled to a gate of a first PMOS transistor 630A. The first PMOS transistor 630A has a source coupled to the node 626, and a drain coupled to the output terminal 612.

The p-type cascode stage 622 also includes a second circuit 624B. The second circuit 624B has two inputs terminals, one of the input terminals is coupled to the node 628 and the other input terminal is coupled to a node 632. An output terminal of the second circuit 624B is coupled to a gate of a second PMOS transistor 630B. The second PMOS transistor 630B has a source coupled to the node 632, and a drain coupled to the output terminal 618.

The first circuit 624A, the second circuit 624B, the first PMOS transistor 630A and the second PMOS transistor 630B in combination form the p-type cascode stage 622.

A PMOS transistor 630C has a gate coupled to the node 628, a source coupled to a drain of a PMOS transistor 630D (also referred to as a second one of the first pair of cross-coupled PMOS transistors) via a node 636, and a drain coupled to the node 626. A PMOS transistor 630E has a gate coupled to the node 628, a source coupled to a drain of a PMOS transistor 630F (also referred to as a first one of the first pair of cross-coupled PMOS transistors) via a node 638, and a drain coupled to the node 632. The PMOS transistor 630C and the PMOS transistor 630E in combination can be referred to as a pair of PMOS transistors. The PMOS transistor 630F has a source coupled to a node 634 (receives an input voltage supply), and a drain coupled to the source of the PMOS transistor 630E. The PMOS transistor 630D has a source coupled to the node 634, and a drain coupled to the source of the PMOS transistor 630C. The PMOS transistor 630D and the PMOS transistor 630F in combination can be referred to as a first pair of cross coupled PMOS transistors.

The cross coupled PMOS transistors store information or voltage values of a switch state, for example the information at the node 618 being at a high voltage (hereinafter referred to as the Vmax) or the information at the node 612 being at the Vmax is stored.

The second circuit 624B includes a second pair of cross coupled NMOS transistors.

In one embodiment, one or more p-type cascode stages can be coupled between the p-type cascode stage and the output terminals (the output 612 and the output 618) of the high-voltage switching circuit 600. Also, one or more n-type cascode stages can be coupled between the n-type cascode stage and the output terminals (the output 612 and the output 618) of the high-voltage switching circuit 600.

For example, the input terminal 506, the input terminal 510, the input terminal 518 and the input terminal 514 of another p-type cascode stage are coupled to the output terminal 508, the output terminal 504, the output terminal 512 and the output terminal 516 of a previous p-type cascode stage. Similarly, the input terminal 306, the input terminal 318, the input terminal 310, and the input terminal 314 of another n-type cascode stage are coupled to the output terminal 308, the output terminal 304, the output terminal 312 and the output terminal 316 of a previous n-type cascode stage.

The cascode stage is needed to reduce electrical stress on individual transistors of the high-voltage switching circuit 600.

The high-voltage switching circuit 600 is capable of selectively passing a high voltage having a voltage level determined by a predefined number of n-type cascode stages and p-type cascode stages from the voltage signals supply terminals (the node 606, the node 614 and the node 604) to the output terminals. The voltage range is equal to the number of cascode stages multiplied by "$V_{ds(max)}$" of each transistor. The voltage range is the input voltage supply range. "$V_{ds(max)}$" is defined by foundry and is process dependent. The number of the n-type cascode stages and the p-type cascode stages can be determined pre-silicon (offline) based on desired high voltage level and device manufacturing specifications.

For example, consider the high-voltage switching circuit 600 having two p-type cascode stages and two n-type cascode stages. The input voltage supply range is: {2V+2V+2V*2=8V}, where the voltage 2V is the voltage across the PMOS transistor 630F, and the voltage 2V is the voltage across the PMOS transistor 630E and the voltage 2V*2 is the voltage across the two p-type cascode stages. Similarly, when the node 606 is at 2V and due to the two n-type cascode stages, the input voltage supply range is: {2V+2V+2V*2=8V}, where the voltage 2V is the voltage at node 606, and the voltage 2V is the voltage across the NMOS transistor 602A, and the voltage 2V*2 is the voltage across the two n-type cascode stages.

The high-voltage switching circuit 600 can work in one or more modes, for example a preset mode and a latched mode. The preset mode is to set correct logic, and the latched mode is to propagate correct voltage from the input voltage supply terminal (the node 634) to the output terminals.

The correct logic is explained by referring to the following example:

When a voltage signal with HI logic level is applied at the node 606, and a voltage signal with LO logic level is applied at the node 614 then the output terminal 612 is coupled to the node 634 during the latched mode. Similarly, if the voltage signal with HI logic level is applied at the node 614 and the voltage signal with LO logic level is applied at the node 606 then the output terminal 618 is coupled to the node 634 during the latched mode.

The correct voltage is explained by referring to the following example:

When the output terminal 618 is coupled to the node 634, the voltage on the output terminal 618 is equal to the Vmax, during the latched mode. When the output terminal 612 is coupled to the node 634, the voltage on the output terminal 612 is equal to the Vmax, during the latched mode.

In one example, the working of the high-voltage switching circuit 600 in the preset mode and the latched mode is explained as follows.

During the preset mode, when a first voltage signal V1 is applied at the node 606 and a second voltage signal V2 is applied at the node 614, the voltage at the node 634 is always the maximum value of the first voltage signal V1 and the second voltage signal second voltage signal V2. The voltage at the node 634 being always the maximum value is explained as follows:

The first voltage signal V1 applied at the node 606 and a third voltage signal V3 applied at the node 604 activates the NMOS transistor 602A which in turn propagates the first voltage signal V1 to the node 608.

The term "active" refers to forming of a channel between a source and a drain of a transistor. The source voltage (Vs) equals the drain voltage (Vd) when the transistor is activated.

The first circuit 610A receives the third voltage signal V3 and the first voltage signal V1 and output the maximum value of the third voltage signal V3 and the first voltage signal V1. The maximum value activates the NMOS transistor 602C to propagate the first voltage signal V1 to the output terminal 612. Simultaneously, the second voltage signal V2 propagates to the node 616 due to the third voltage signal V3 applied at the node 604. The second circuit 610B outputs the maximum of the third voltage signal V3 and the second voltage signal V2. The maximum value activates the NMOS transistor 602D to propagate the second voltage signal V2 to the output terminal 618.

The fourth voltage signal V4 at the node 628 activates the PMOS transistor 630C, the PMOS transistor 630A, the PMOS transistor 630B and the PMOS transistor 630E to propagate the first voltage signal V1 or the second voltage signal V2 to the node 634 by activating either the PMOS transistor 630F or the PMOS transistor 630D. If the first voltage signal V1 is higher than the second voltage signal V2 then the PMOS transistor 630D is active and if V2 is higher than the first voltage signal V1 then the PMOS transistor 630F is active. Thus the voltage at the node 634 is always the maximum value of the first voltage signal V1 and the second voltage signal V2 during the preset mode.

During the latched mode, the Vmax is applied at the node 634 and the fifth voltage signal V5 is applied at the node 628 to propagate the Vmax to the output terminal 612 or the output terminal 618. If the first voltage signal V1 is higher than the second voltage signal V2 then the Vmax is propagated to the output terminal 612 and if V2 is higher than the first voltage signal V1 then the Vmax is propagated to the output terminal 618. The propagation of the Vmax is explained as follows:

The Vmax propagates to the node 626 from the node 634 if V1 is higher than the second voltage signal V2 (V2=0V). Further, due to the fifth voltage signal V5 at the node 628, the PMOS transistor 630A is active and propagates the Vmax to the node 612. Simultaneously, due to the second voltage signal V2 being at 0V and the NMOS transistor 602B, and the NMOS transistor 602D are active and the voltage at the output terminal 618 is at 0V. Also, the first voltage signal V1 at the node 606 inactivates the NMOS transistor 602A and the NMOS transistor 602C such that the current path from the output terminal 612 to ground is cut off. Further, the PMOS transistor 630F, the PMOS transistor 630E, and the PMOS transistor 630B experience a voltage drop such that the current path from the Vmax to the output terminal 618 is cut off.

In another example, the working of the high-voltage switching circuit 600 in the preset mode and the latched mode is explained as follows.

In one example, in a preset mode the first voltage signal V1 includes a voltage signal having magnitude 2V, the second voltage signal V2 includes a voltage signal having magnitude 0V, the third voltage signal V3 includes a voltage signal having magnitude 2V, and the fourth voltage signal V4 includes a voltage signal having magnitude 0V.

During the preset mode, when the first voltage signal V1 is applied at the node 606, and the third voltage signal V3 is applied at the node 604, the NMOS transistor 602A is active and propagates a voltage of 1.5V (the first voltage signal) to the node 608 due to a voltage drop of 0.5V. The voltage drop may vary based on the manufacturing specifications of the NMOS transistor 602A. The first circuit 610A receives an input voltage of 2V from the node 604 and an input voltage of 1.5V from the node 608 to output a maximum voltage value (2V) at the gate of the NMOS transistor 602C. The NMOS transistor 602C is active and propagates an output voltage of 1.5V to the output terminal 612.

Simultaneously, the second voltage signal V2 at the node 614 and the third voltage signal V3 at the node 604 activate the NMOS transistor 602B. A voltage of 0V is propagated to the node 616. The second circuit 610B receives an input voltage of 0V from the node 616 and an input voltage of 2V from the node 604 to output a maximum voltage value (2V) at the gate of the NMOS transistor 602D. The NMOS transistor 602D is active and propagates an output voltage of 0V to the output terminal 618.

The fourth voltage signal V4 applied at the node 628 activates the PMOS transistor 630C. The first circuit 624A thus outputs a minimum of voltage value (0V) of its inputs to the gate of the PMOS transistor 630A. The PMOS transistor 630A becomes active to propagate the voltage of 1.5V from the output terminal 612 to the node 626. Also, the fourth voltage signal V4 applied at the node 628 activates the PMOS transistor 630E. The second circuit 624B thus outputs a minimum of voltage value (0V) of its inputs to the gate of the PMOS transistor 630B. The PMOS transistor 630B goes active to propagate the voltage of 0V from the output terminal 618 to the node 632 with a voltage of 0.5V. The voltage increase of 0.5V may vary based on the manufacturing specifications of the PMOS transistor 630B.

The voltage of 0.5V at the node 632 activates the PMOS transistor 630D via the PMOS transistor 630E. The voltage of 1.5V (at the node 626) is propagated to the node 634 via PMOS transistor 630D. Thus the voltage at the node 634 is equivalent to the voltage at the output terminal 612.

In some embodiments, the voltage at the node 634 is equal to a difference between a maximum of (a voltage signal at the node 606, a voltage signal at the node 614) and the threshold voltage of the NMOS transistor 602A (or a threshold voltage of the NMOS transistor 602B). Thus the voltage at the node 634 (1.5V)=maximum of (the voltage signal at the node 606 (2V), voltage signal at the node 614 (0V))−the threshold voltage of the NMOS transistor 602A (0.5V).

In one embodiment, if a voltage signal of 2V is applied at the node 614 and a voltage signal of 0V is applied at the node 606 then the PMOS transistor 630F is activated and the PMOS transistor 630D is inactivated.

In one embodiment, the high-voltage switching circuit 600 attains a first state or a second state. During the first state the PMOS transistor 630F is activated and the PMOS transistor 630D is inactivated when the first voltage signal V1 is applied at the node 614 and the second voltage signal V2 is applied at the node 606. During the second state the PMOS transistor 630F is inactivated and the PMOS transistor 630D is activated when the first voltage signal V1 is applied at the node 606 and the second voltage signal V2 is applied at the node 614.

In one example, in the latched preset mode the first voltage signal V1 includes a voltage signal having magnitude 2V, the second voltage signal V2 includes a voltage signal having magnitude 0V, the third voltage signal V3 includes a voltage signal having magnitude 2V, and the fifth voltage signal V5 includes a voltage signal having a magnitude lesser than the Vmax by 2V, for example V5=4V when the Vmax=6V.

The latched mode begins after the high-voltage switching circuit 600 attains the first state or the second state. The first state and the second state will persist as long as the high-voltage switching circuit 110A and the high-voltage switching circuit 110B are in the latched mode.

During the latched mode, the PMOS transistor 630F is responsive to high-voltage switching at the node 634 to enable propagation of the high-voltage switching at the node 634 to the output terminal 618 in conjunction with the p-type cascode stage 622. Generation of the high-voltage switching is explained as follows:

In one example, at the end of the preset mode, the high-voltage switching circuit 600 having attained the second state i.e. the PMOS transistor 630D is activated and the PMOS transistor 630F is inactivated when the first voltage signal V1 is applied at the node 606 and the second voltage signal V2 is applied at the node 614. A high voltage (the Vmax), for example 6V, is applied at the node 634, and the fifth voltage signal V5, for example 4V, is applied at the node 628. The PMOS transistor 630C is activated as voltage at the node 636 equals the Vmax. The node 636 is coupled to the drain of the PMOS transistor 630D and the source of the PMOS transistor 630C. The PMOS transistor 630C propagates the voltage of 6V from the node 636 to the node 626. The first circuit 624A receives an input voltage of 6V from the node 626 and an input voltage of 4V from the node 628 to output a voltage of 4V at the gate of the PMOS transistor 630A. The PMOS transistor 630A is activated and propagates the voltage of 6V from the node 626 to the output terminal 612.

Simultaneously, the PMOS transistor 630F is inactivated and propagates a voltage of 4V to the drain of the PMOS transistor 630F, due to a voltage drop of 2V at the PMOS transistor 630F. The voltage drop of 2V may vary based on manufacturing specifications of the PMOS transistors. Similarly due to the voltage drop of 2V at each of the PMOS transistor 630E and the PMOS transistor 630B, a voltage of 0V is propagated to the output terminal 618.

Simultaneously, due to the voltage of 6V at the output terminal 612, the NMOS transistor 602C experiences a voltage drop of 2V and a voltage of 4V is propagated to the node 608.

The first circuit 610A receives an input voltage of 4V from the node 608 and an input voltage of 2V from the node 604 to output a voltage of 4V to the gate of the NMOS transistor 602C. The NMOS transistor 602C is inactivated. Similarly, due the voltage of 4V at the node 608, the NMOS transistor 602A experiences a voltage drop of 2V and the voltage of 2V is propagated to the node 606.

The second voltage signal V2 at the node 614 and the third voltage signal V3 at the node 604 activate the NMOS transistor 602B to propagate the voltage of 0V to the node 616. The second circuit 610B receives an input voltage of 0V from the node 616 and an input voltage of 2V from the node 604 to output a voltage of 2V to the gate of the NMOS transistor 602D. The NMOS transistor 602D being activated propagates a voltage of 0V to the output terminal 618.

Thus during the latched mode, the n-type cascode stage 620 retains the voltage at the node 612 or the node 618 at 0V.

In one embodiment, if the high-voltage switching circuit 600 is in the first state having the PMOS transistor 630F active and the PMOS transistor 630D inactive, then the voltage of 6V at the node 634 is propagated to the output terminal 618 and the voltage of 0V at the node 606 is propagated to the output terminal 612.

Thus during the latched mode either the node 618 equals the Vmax or the node 612 equals the Vmax.

In another embodiment, the circuit excludes the NMOS transistor 602A and the NMOS transistor 602B and the voltage signals are provided at the node 608 (the first voltage signal V1), the node 616 (the second voltage signal V2) and the node 604 (the third voltage signal V3). The n-type cascode stage is coupled between the output terminals and the voltage signals supply terminals. For example, the n-type cascode stage 620 is coupled between the output terminals (the output terminal 612 and the output terminal 618) and the voltage signals supply terminals (the node 608, the node 616, and the node 604).

Figure 7A:
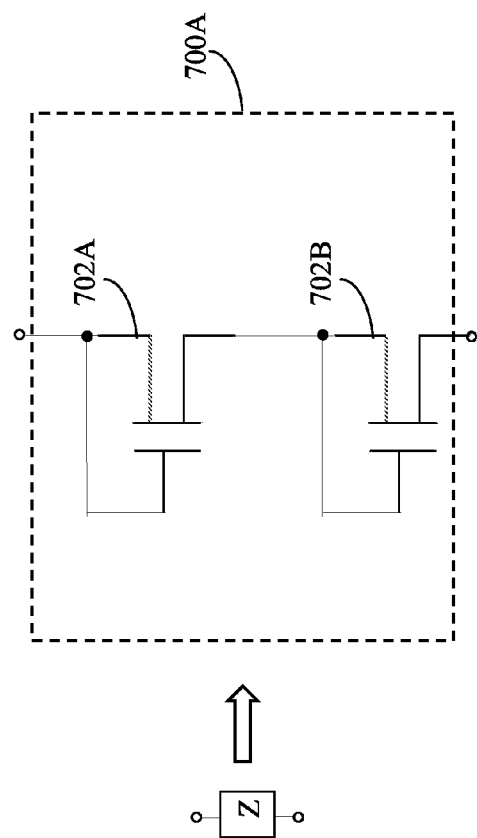
FIG. 7A and FIG. 7B illustrate an auxiliary component in accordance with one embodiment.

FIG. 7A illustrates an auxiliary component (an impedance "Z") 700A. The auxiliary component 700A includes one or more NMOS transistor-based diodes coupled in series, for example an NMOS transistor-based diode 702A coupled in series connection with an NMOS transistor-based diode 702B.

In one embodiment, examples of the impedance "Z" include, but are not limited to, a resistor, a forward biased diode, a reversed biased diode, a diode-connected PMOS, a diode-connected NMOS, an NPN bipolar junction transistor (BJT), and a PNP BJT.

Figure 7B:
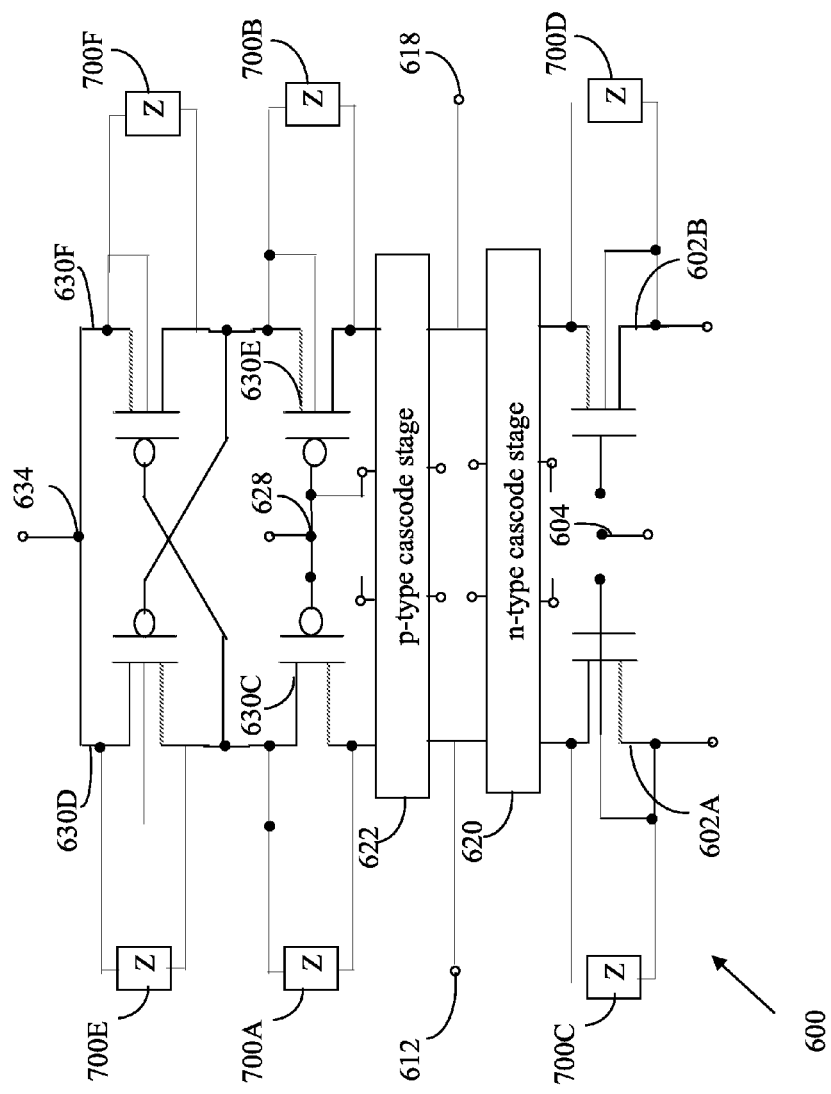

FIG. 7B illustrates the high-voltage switching circuit 600 having one or more auxiliary components. The PMOS transistor 630C and the PMOS transistor 630E are coupled in parallel connection with the auxiliary component 700A and an auxiliary component 700B. The PMOS transistor 630D and the PMOS transistor 630F are coupled in parallel connection with an auxiliary component 700E and an auxiliary component 700F. The one or more auxiliary components protect transistors (PMOS transistors and NMOS transistors) from drain-to-source breakdown voltage. Also, the NMOS transistor 602A and the NMOS transistor 602B are coupled in parallel connection with an auxiliary component 700C and an auxiliary component 700D.

The structure of the auxiliary component 700A is similar to the structure of the auxiliary component 700B, the auxiliary component 700C, the auxiliary component 700D, the auxiliary component 700E, and the auxiliary component 700F.

In some embodiments, the auxiliary component 700A is in parallel connection with the NMOS transistor 302A, and the auxiliary component 700B is in parallel connection with the NMOS transistor 302B.

In some embodiments, the auxiliary component 700A is in parallel connection with the PMOS transistor 502A, and the auxiliary component 700B is in parallel connection with the PMOS transistor 502B.

In some embodiments, the auxiliary component 700A may be optional and can be replaced with transistors having sufficient drain-to-source leakage current, the transistors will self-bias such that the voltage drop across drain-to-source will distribute evenly for all the transistors connected in series.

Figure 8:
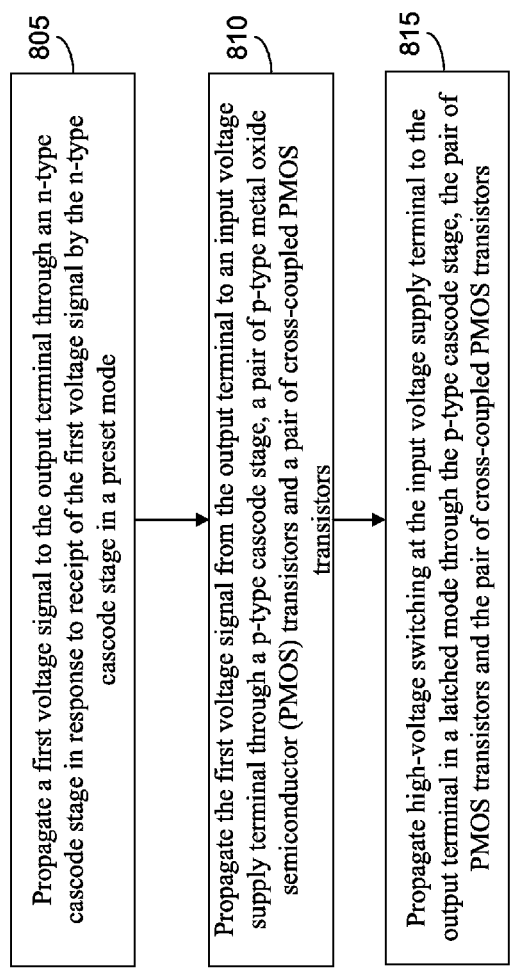
FIG. 8 illustrates a method for generating high-voltage switching in accordance with one embodiment.

FIG. 8 illustrates a method for providing high-voltage switching at the output terminal 612 of the high-voltage switching circuit 600. Considering the case where the voltage of 2V is applied at the node 606 and the voltage of 0V is applied at the node 614.

At step 805, a first voltage signal is propagated to the output terminal (the output terminal 612) through the n-type cascode stage, for example the n-type cascode stage 620, in response to receipt of the first voltage signal by the n-type cascode stage in the preset mode.

In one embodiment, the n-type cascode stage 620 outputs a maximum voltage value of two inputs.

In one embodiment, preset voltage signals (desired voltage signals) are propagated to the pair of cross-coupled PMOS transistors (the PMOS transistor 630D and the PMOS transistor 630F) in response to the preset voltage signals. The preset voltage signals may be received by a preset helper circuit, for example a preset helper circuit 1000, in the preset mode to generate desired voltages at the sources of the pair of cross-coupled PMOS transistors.

At step 810, the first voltage signal is propagated from the output terminal to an input voltage supply terminal through a p-type cascode stage, for example the p-type cascode stage 622, a pair of PMOS transistors (the PMOS transistor 630C and the PMOS transistor 630E) and the pair of cross-coupled PMOS transistors (the PMOS transistor 630D and the PMOS transistor 630F).

At step 815, high-voltage switching at the input voltage supply terminal is propagated to the output terminal in the latched mode through the p-type cascode stage, the pair of PMOS transistors and the pair of cross-coupled PMOS transistors.

In one embodiment, the p-type cascode stage 622 outputs a minimum voltage value of two inputs.

Figure 9A:
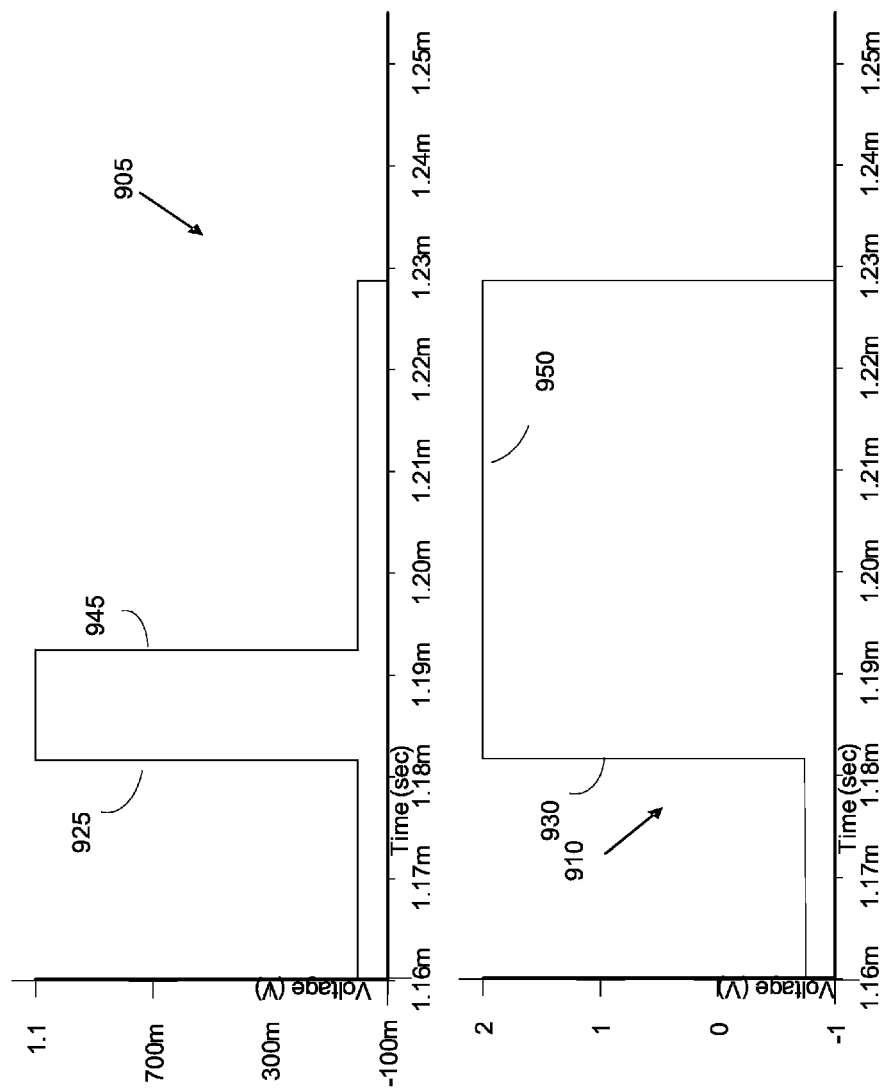
FIG. 9A and FIG. 9B are graphical representation of behavior of a high-voltage switching circuit in accordance with one embodiment.
Figure 9B:
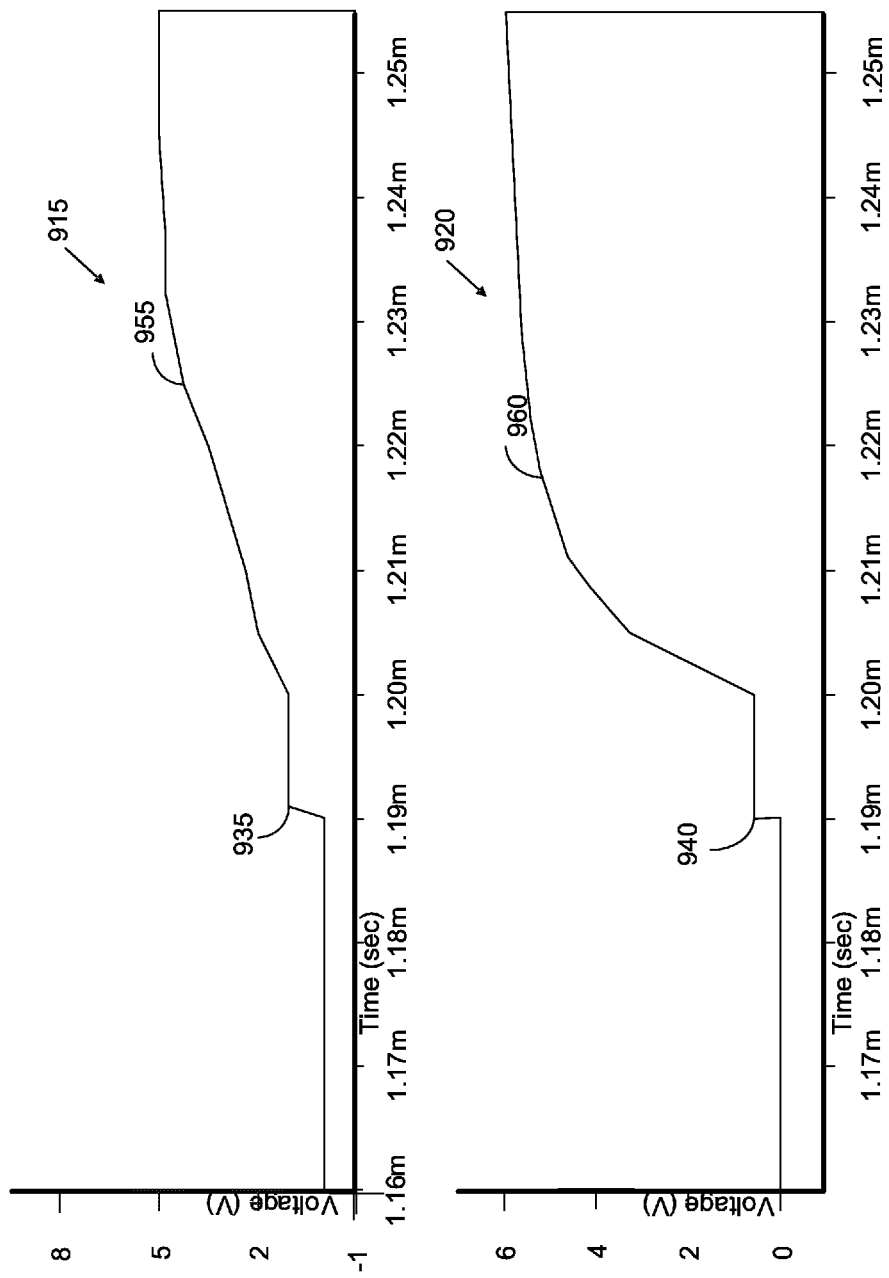

FIG. 9A and FIG. 9B are graphical representation of behavior of a high-voltage switching circuit 600.

Y-axis represents voltage, in volts (V), and X-axis represents time in seconds.

The graphical representation includes a waveform 905 corresponding to a control signal, a waveform 910 corresponding to the input voltage at the node 606, a waveform 915 corresponding to a signal at the output terminal 612, and a waveform 920 corresponding to a signal at the node 634.

The waveform 905 controls the modes of operation of the high-voltage switching circuit 600. When the waveform 905 goes from 0V to 1.1V (a transition 925) the high-voltage switching circuit 600 is considered to be working in the preset mode. During the preset mode, the waveform 910 goes from 0V to 2V (a transition 930). The waveform 910 at the voltage of 2V is applied to the node 606. The n-type cascode stage 620 in conjunction with the NMOS transistor 602A enables propagation of the voltage of 1.5V to the output terminal 612. Thus the waveform 915 goes from 0V to 1.5V (a transition 935) in response to the transition 930. The waveform 920 goes from 0V to 1.5V (a transition 940) in response to the transition 935, due to the voltage 1.5V propagating from the output terminal 612 to the node 634.

When the waveform 905 goes from 1.1V to 0V (a transition 945) the high-voltage switching circuit 600 is considered to be working in the latched mode. During the latched mode, the waveform 910 is at 2V (a transition 950). Thus the waveform 915 follows the waveform 920 from 1.5V to 6V (a transition 955) in response to the transition 930. The waveform 920 goes from 1.5V to 6V (a transition 960). For example, a voltage of 4V is applied at the node 628 and a voltage of 6V is applied at the node 634 to enable propagation of the waveform 915 from 1.5V to 6V.

Thus the waveform 920 follows the waveform 915 during the preset mode and the waveform 915 follows the waveform 920 during the latched mode.

Figure 10:
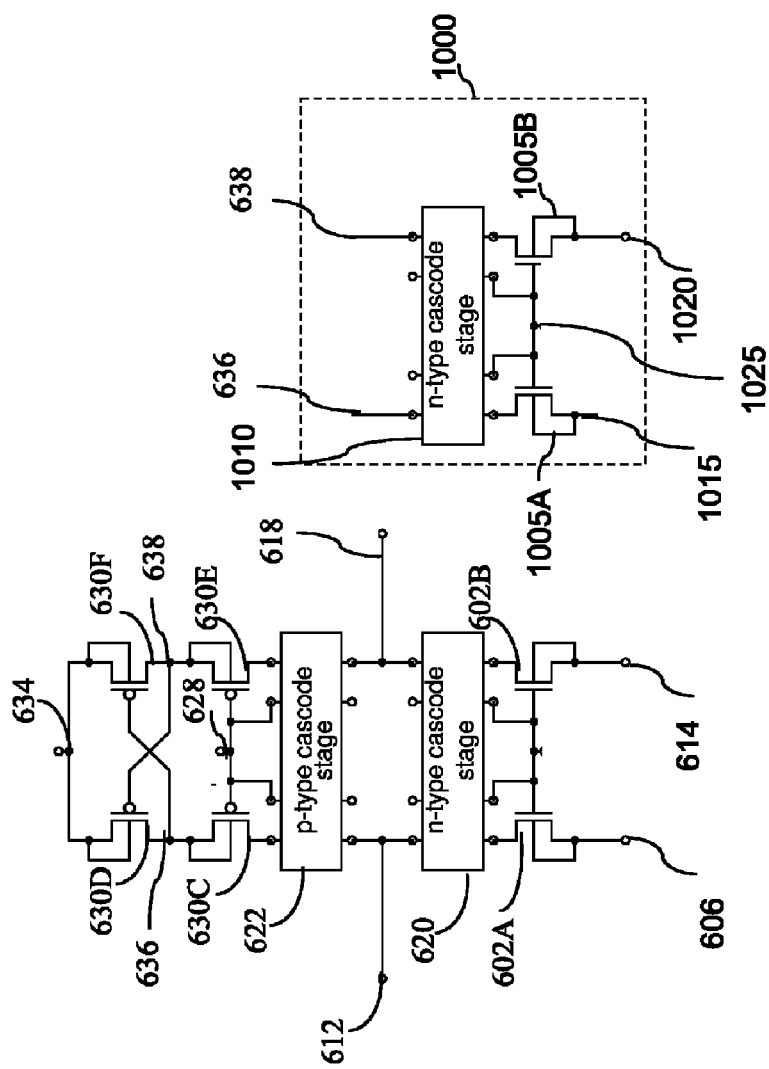
FIG. 10 is a preset helper circuit in accordance with one embodiment.

FIG. 10 is the preset helper circuit 1000 and can be used in the high-voltage switching circuit 600. The preset helper circuit 1000 provides more robust conditions in the high-voltage switching circuit 600. Nodes, for example the node 636 and the node 638, of the preset helper circuit 1000 are coupled to drains of the first pair of cross-coupled PMOS transistors (the PMOS transistor 630D and the PMOS transistor 630F) to generate desired voltages at the drains. The preset helper circuit 1000 includes another instance of the pair of NMOS transistors, for example an NMOS transistor 1005A and an NMOS transistor 1005B. The NMOS transistor 1005A and the NMOS transistor 1005B are similar in structure and function as the NMOS transistor 602A and the NMOS transistor 602B. The preset helper circuit 1000 includes another instance of the n-type cascode stage 1010.

In one embodiment, the preset helper circuit 1000 includes one or more instances of n-type cascode stages. The one or more instances of n-type cascode stages are similar in structure and function as the n-type cascode stage 1010. The one or more instances of n-type cascode stages can be coupled between the n-type cascode stage 1010 and the nodes (the node 636 and the node 638).

The n-type cascode stage 1010 is similar in structure and function to circuit 300. Another instance of the pair of NMOS tranistors in conjunction with another instance of the n-type cascode stage 1010 generate the desired voltages in response to the pair of preset voltage signals and the third voltage signal V3. The third voltage signal V3 is at 2V during the preset mode and the latched mode. The pair of preset voltage signals may be applied at an input terminal 1015 and an input terminal 1020 and the third voltage signal V3 may be applied at an input terminal 1025. In one example, the preset helper circuit 1000 compensates for propagating the desired voltage to the drain of the PMOS transistor 630F. The propagation of the desired voltage avoids the drop of 0.5V at the PMOS transistor 630B making the high-voltage switching circuit 600 robust. TABLE 1 illustrates the function the of the preset helper circuit 1000 in one embodiment.

TABLE 1

| Vmax propagates to the output terminal 618 | Preset mode | Latched mode |
|---|---|---|
| high voltage switching preset signal (waveform 905) | HI | LO |
| V1 | LO | LO |
| V2 | HI | HI |
| First preset voltage signal | LO | HI |
| Second preset voltage signal | HI | HI |

During the preset mode, a high voltage switching preset signal (the waveform 905) is at logic level HI, the first voltage signal V1 at the node 606 is at logic level LO, the second voltage signal V2 at the node 614 is at logic level HI, a first preset voltage signal at the node 1015 is at logic level LO, and a second preset voltage signal at the node 1020 is at logic level HI.

Thus during the preset mode, the node 636 is at logic level LO and the node 638 is at logic level HI. Voltages at the node 636 and the node 638 may be supplied to the drain of the PMOS transistor 630D and the drain of the PMOS transistor 630F respectively to achieve the desired voltages at the drains. Thus the logic level LO is obtained at the drain of the PMOS transistor 630D to activate the PMOS transistor 630F. Thus the second voltage signal V2 is propagated to the node 634.

During the latched mode, the high voltage switching preset signal (the waveform 905) is at logic level LO, the first voltage signal V1 at the node 606 is at logic level LO, the second voltage signal V2 at the node 614 is at logic level HI, a first preset voltage signal at the node 1015 is at logic level HI, and a second preset voltage signal at the node 1020 is at logic level HI. Thus the Vmax propagates to the output terminal 618.

TABLE 2 illustrates the function the of the preset helper circuit 1000 in another embodiment.

| Vmax propagates to the output terminal 612 | Preset mode | Latched mode |
|---|---|---|
| high voltage switching preset signal (waveform 905) | HI | LO |
| V1 | HI | HI |
| V2 | LO | LO |
| First preset voltage signal | HI | HI |
| Second preset voltage signal | LO | HI |

During the preset mode, the high voltage switching preset signal (the waveform 905) is at logic level HI, the first voltage signal V1 at the node 606 is at logic level HI, the second voltage signal V2 at the node 614 is at logic level LO, a first preset voltage signal at the node 1015 is at logic level HI, and a second preset voltage signal at the node 1020 is at logic level LO.

Thus during the preset mode, the node 636 is at logic level HI and the node 638 is at logic level LO. Voltages at the node 636 and the node 638 may be supplied to the drain of the PMOS transistor 630D and the drain of the PMOS transistor 630F respectively to achieve the desired voltages at the drains. Thus the logic level LO is obtained at the drain of the PMOS transistor 630F to activate the PMOS transistor 630D during the second state of the high-voltage switching circuit 600. Thus the first voltage signal V1 is propagated to the node 634.

During the latched mode, the high voltage switching preset signal (the waveform 905) is at logic level LO, the first voltage signal V1 at the node 606 is at logic level HI, the second voltage signal V2 at the node 614 is at logic level LO, a first preset voltage signal at the node 1015 is at logic level HI, and a second preset voltage signal at the node 1020 is at logic level HI. Thus the Vmax propagates to the output terminal 612.

Figure 11:
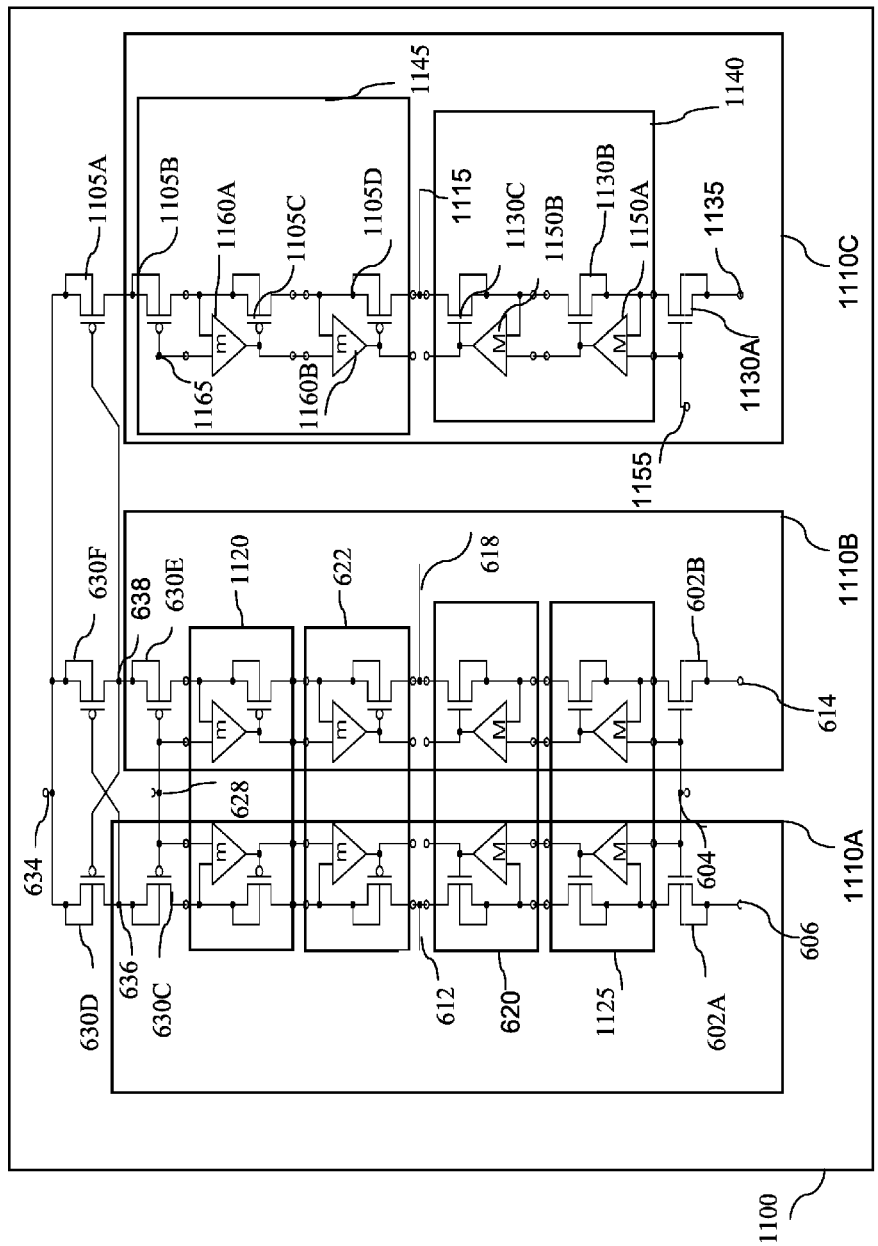
FIG. 11 is a three branch high-voltage switching circuit in accordance with one embodiment.

FIG. 11 is a three branch high-voltage switching circuit 1100 (hereinafter referred to as the circuit 1100) for generating tri-state output. The circuit 1100 includes a first p-type metal oxide semiconductor (PMOS) transistor, for example the PMOS transistor 630D, having the source coupled to the node 634. The circuit 1100 also includes a second PMOS transistor, for example the PMOS transistor 630F, having the source coupled to the node 634. A third PMOS transistor, for example a PMOS transistor 1105A, having a source coupled to the node 634, a gate coupled to the node 638 and a drain coupled to a source of a PMOS transistor 1105B.

A first branch 1110A defines a first output terminal, for example the output terminal 612, and coupled to the drain of the PMOS transistor 630D. A second branch 1110B defines a second output terminal, for example the output terminal 618, and coupled to the drain of the PMOS transistor 630F. A third branch 1110C defines a third output terminal, for example an output terminal 1115, and coupled to the drain of the PMOS transistor 1105A.

The first branch 1110A, the second branch 1110B are organized similarly as in FIG. 6. The first branch 1110A, the second branch 1110B also have an additional p-type cascode stage 1120 (similar in structure and function as the p-type cascode stage 622) and an n-type cascode stage 1125 (similar in structure and function as the n-type cascose stage 620). The p-type cascode stage 1120 is coupled between the pair of PMOS transistors, for example the PMOS transistor 630C and the PMOS transistor 630E, and the p-type cascode stage 622. The n-type cascode stage 1125 is coupled between the n-type cascose stage 620 and the pair of NMOS transistors, for example the NMOS transistor 602A and the NMOS transistor 602B.

In various embodiments, the p-type cascode stage 1120 and the n-type cascode stage 1125 are way of representation in FIG. 11. Also, the number of p-type cascode stages and the number of n-type cascode stages may vary based on device manufacturing specifications.

The first branch 1110A, the second branch 1110B and the third branch 1110C are similar in structure and in functioning. For example, the structure of third branch 1110C is as follows:

The third branch 1110A includes a first n-type metal oxide semiconductor (NMOS) transistor, for example an NMOS transistor 1130A receiving a voltage signal from a node 1135. A circuit of first type 1140 coupled between the NMOS transistor 1130A and the output terminal 1115 to enable generation of an output at the output terminal 1115. A circuit of second type 1145 coupled between the output terminal 1115 and the drain of the PMOS transistor 1105A to enable generation of the output at the output terminal 1115 in conjunction with the NMOS transistor 1130A, the circuit of first type 1140 and the PMOS transistor 1105A.

The circuit of first type 1140 includes a first circuit 1150A, a second circuit 1150B, an NMOS transistor 1130B, and an NMOS transistor 1130C.

The first circuit 1150A is coupled to a second NMOS transistor, for example the NMOS transistor 1130B. The second circuit 1150B is coupled to a third NMOS transistor, for example the NMOS transistor 1130C.

The first circuit 1150A is responsive to two inputs to output a maximum of the two inputs. The first circuit 1150A is similar in structure and function as the first circuit 200A.

At least one input of the first circuit 1150A is coupled to a node 1155, another input is coupled to a source of the NMOS transistor 1130B, and output is coupled to the gate of the NMOS transistor 1130B. The first circuit 1150A includes a first pair of cross-coupled PMOS transistors. Another input of the first circuit 1150A is also coupled to the drain of the NMOS transistor 1130A. A gate of the NMOS transistor 1130A is also coupled to the node 1155. The node 1155 is further coupled to the node 604 to receive the third voltage signal V3. The source of the NMOS transistor 1130B is also coupled to the drain of the NMOS transistor 1130A, and a drain coupled to a source of the NMOS transistor 1130C.

The second circuit 1150B is also coupled the NMOS transistor 1130B. The second circuit 1150B is responsive to two inputs to output a maximum of the two inputs. The second circuit 1150B includes a second pair of cross-coupled PMOS transistors. The structure and function of the second circuit 1150B is similar to the first circuit 1150A. At least one input of the second circuit 1150B is coupled to the output of the first circuit 1150A, another input is coupled to a drain of the NMOS transistor 1130B, and output is coupled to a gate of the NMOS transistor 1130C. A drain of the NMOS transistor 1130C is coupled to the output terminal 1115.

The circuit of second type 1145 includes a third circuit 1160A, a fourth circuit 1160B, the PMOS transistor 1105B, a PMOS transistor 1105C and a PMOS transistor 1105D.

The third circuit 1160A is coupled to the PMOS transistor 1105B and the PMOS transistor 1105C. The third circuit 1160A is responsive to two inputs to output a minimum of the two inputs. The third circuit 1160A includes a first pair of cross-coupled NMOS transistors. The structure and function of the third circuit 1160A is similar to the circuit 400A. One input of the third circuit 1160A is coupled to a node 1165, another input is coupled to a drain of the PMOS transistor 1105B, and output is coupled to a gate of the PMOS transistor 1105C. The node 1165 is coupled to the node 628. The source of the PMOS transistor 1105B is coupled to the drain of the PMOS transistor 1105A, a gate coupled to the node 1165 and a drain is coupled to a source of the PMOS transistor 1105C. A drain of the PMOS transistor 1105C is coupled to a source of the PMOS transistor 1105D.

The fourth circuit 1160B is coupled to the PMOS transistor 1105D, the PMOS transistor 1105C and the third circuit 1160A. The fourth circuit 1160B is responsive to two inputs to output a minimum of the two inputs. The fourth circuit 1160B includes a second pair of cross-coupled NMOS transistors. The structure and function of the fourth circuit 1160B is similar to the third circuit 1160A. At least one input of the fourth circuit 1160B is coupled to the gate of the PMOS transistor 1105C, another input is coupled to the drain of the PMOS transistor 1105C, and output is coupled to a gate of the PMOS transistor 1105D. The source of the PMOS transistor 1105D is coupled to the drain of the PMOS transistor 1105C and a drain is coupled to the output terminal 1115.

The first branch 1110A generates one of 0 volts and a voltage equivalent to that at the node 634 (the input voltage supply), the second branch 1110B generates one of 0 volts and the voltage equivalent to that at the node 634, and the third branch 1110C generates one of 0 volts, a high impedance (HI-Z) state and the voltage equivalent to that at the node 634 based on the voltage signal received by the NMOS transistor of each branch, for example the NMOS transistor 1130A. Generating the voltage equivalent to that at the input voltage supply terminal includes high-voltage switching.

The third branch 1110C separates load on the output terminal 1115 from the output terminal 618 as the load on the output terminal 1115 may be large to be put on the output terminal 618 and interferes during operations performed in the preset mode.

In one embodiment, the circuit 1100 allows a tri-state output. For example, the tri state outputs may be 0V, the Vmax and the high impedance state. The input voltages may be applied at the node 606, the node 614 and the node 1135.

TABLE 1 illustrates the function the circuit 1100 in one embodiment.

TABLE 1

| input | | | output | | |
|---|---|---|---|---|---|
| Voltage at the node 606 | Voltage at the node 614 | Voltage at the node 1135 | Voltage at the output terminal 612 | Voltage at the output terminal 618 | Voltage at the output terminal 1115 |
| 0 | 0 | 0 | | invalid | |
| 0 | 0 | 1 | | invalid | |
| 0 | 1 | 0 | 0 | Vmax | 0 |
| 0 | 1 | 1 | 0 | Vmax | High impedance state (HI-Z) |
| 1 | 0 | 0 | | invalid | |

TABLE 1-continued

| input | | | output | | |
|---|---|---|---|---|---|
| Voltage at the node 606 | Voltage at the node 614 | Voltage at the node 1135 | Voltage at the output terminal 612 | Voltage at the output terminal 618 | Voltage at the output terminal 1115 |
| 1 | 0 | 1 | Vmax | 0 | Vmax |
| 1 | 1 | 0 | | invalid | |
| 1 | 1 | 1 | | invalid | |

When a logic level LO is applied at the node 606, the node 614, and the node 1135, the output voltages at each of the branch will be invalid. Similarly when a logic level HI is applied at the node 606, the node 614, and the node 1135, the output voltages at each of the branch will be invalid. When a logic level LO is applied at the node 606, the node 614, and a logic level HI is applied at the node 1135, the output voltages at each of the branch will be invalid. When a logic level HI is applied at the node 606, the node 614, and a logic level LO is applied at the node 1135, the output voltages at each of the branch will be invalid. When a logic level LO is applied at the node 614, the node 1135, and a logic level HI is applied at the node 606, the output voltages at each of the branch will be invalid. The invalid state is due to incorrect bias conditions to the PMOS transistor 630D, the PMOS transistor 630F and the PMOS transistor 1105A such that either there is a high current path from the node 634 to ground or the circuit 1100 stays in an undetermined state.

When a logic level HI is applied at the node 614, a logic level LO is applied the node 1135, and a logic level LO is applied at the node 606, the output voltages at the output terminal 612 is at logic level LO, the output terminal 618 is at the Vmax, the output terminal 1115 is at logic level LO.

When a logic level LO is applied at the node 614, a logic level HI is applied the node 1135, and a logic level HI is applied at the node 606, the output voltages at the output terminal 612 is at the Vmax, the output terminal 618 is at logic level LO, the output terminal 1115 is at the Vmax.

When a logic level HI is applied at the node 614, a logic level HI is applied the node 1135, and a logic level LO is applied at the node 606, the output voltages at the output terminal 612 is at a logic level LO, the output terminal 618 is at the Vmax, the output terminal 1115 is at the high impedance state.

In one embodiment, the third branch 1110C is independently controlled for generating one of 0 volts, the high impedance state, and the voltage equivalent to that at the node 634 based on the first voltage signal V1 and the third voltage signal V3 received at the source of the NMOS transistor 1130B and the node 1155.

It is appreciated that the high-voltage switching circuit 600 can be used for any reasonable high voltages by adding sufficient cascode stages (the n-type cascode stage 620 and p-type cascode stage 622). Thus the high-voltage switching circuit 600 can remove the voltage restriction. Also, the high-voltage switching circuit 600 when used in one or more semiconductor devices can provide high-voltage switching to reduce product cost. In addition, voltage related stress, functional risks, is also reduced. Also, the p-type cascode stages and the n-type cascode stages reduce stress of the transistors and enhance reliability of the high-voltage switching circuit 600. Further, the high-voltage switching circuit 600 is independent of the LDMOS making the high-voltage switching circuit 600 a cost effective circuitry.

In the foregoing discussion, the term "coupled" or "connection" refers to either a direct electrical connection between the devices coupled or an indirect connection through intermediary devices. The term "circuit" means at least either a single component or a multiplicity of components, that are coupled together to provide a desired function. The term "signal" means at least one current, voltage, charge, data, or other signal. The term "prevent" or "preventing" refers to minimization.

Those skilled in the art will recognize that a wide variety of modifications, alterations, and combinations can be made with respect to the above described embodiments without departing from the scope of the disclosure, and that such modifications, alterations, and combinations are to be viewed as being within the ambit of the disclosure.

What is claimed is:

1. A circuit for switching voltage at an first and second output terminals of the circuit, the circuit comprising:
   an n-type cascode stage coupled between the first and second output terminals and a pair of terminals through which a pair of voltage signals is applied to the n-type cascode stage, the n-type cascode stage enabling propagation of a first voltage signal to the first and second output terminals in a preset mode in response to a third voltage signal, the pair of voltage signals comprising the first voltage signal and a second voltage signal;
   a p-type cascode stage coupled to the first and second output terminals to enable propagation of the first voltage signal to an input voltage supply terminal of the circuit;
   a first pair of cross-coupled p-type metal oxide semiconductor (PMOS) transistors coupled to the input voltage supply terminal and responsive to voltage switching at the input voltage supply terminal to switch voltage at the first and second output terminals in a latched mode; and
   a pair of PMOS transistors, coupled between the first pair of cross-coupled PMOS transistors and the p-type cascode stage, that is responsive to the first voltage signal to inactivate a first one of the first pair of cross-coupled PMOS transistors and activate a second one of the first pair of cross-coupled PMOS transistors in the preset mode to enable propagation of the first voltage signal to the input voltage supply terminal and is responsive to the voltage switching at the input voltage supply terminal and a fourth voltage signal to enable propagation of the voltage switching at the input voltage supply terminal to the first and second output terminals in the latched mode in conjunction with the p-type cascode stage.

2. The circuit as claimed in claim 1, wherein the n-type cascode stage comprises:
   a first circuit having two inputs and outputting a maximum value of the two inputs of the first circuit;
   a second circuit having two inputs and outputting a maximum value of the two inputs of the second circuit;
   a first n-type metal oxide semiconductor (NMOS) transistor having a gate terminal coupled to an output terminal of the first circuit; and
   a second NMOS transistor having a gate terminal coupled to an output terminal of the second circuit.

3. The circuit as claimed in claim 2, wherein the first circuit comprises a second pair of cross-coupled PMOS transistors.

4. The circuit as claimed in claim 3, wherein the second circuit comprises a third pair of cross-coupled PMOS transistors.

5. The circuit as claimed in claim 1, wherein the p-type cascode stage comprises:
   a first circuit having two inputs and outputting a minimum value of the two inputs of the first circuit;
   a second circuit having two inputs and outputting a minimum value of the two inputs of the second circuit;
   a first PMOS transistor having a gate terminal coupled to an output terminal of the first circuit; and
   a second PMOS transistor having a gate terminal coupled to an output terminal of the second circuit.

6. The circuit as claimed in claim 5, wherein the first circuit comprises:
   a first pair of cross-coupled NMOS transistors.

7. The circuit as claimed in claim 6, wherein the second circuit comprises:
   a second pair of cross-coupled NMOS transistors.

8. The circuit as claimed in claim 1 further comprising:
   one or more further p-type cascode stages coupled between the p-type cascode stage and the first and second output terminals of the circuit, the one or more further p-type cascode stages reducing electrical stress of the circuit.

9. The circuit as claimed in claim 1 further comprising:
   one or more further n-type cascode stages coupled between the n-type cascode stage and the first and second output terminals of the circuit, the one or more further n-type cascode stages reducing electrical stress of the circuit.

10. The circuit as claimed in claim 1 further comprising:
    a pair of NMOS transistors, coupled between the pair of terminals and the n-type cascode stage, and responsive to the third voltage signal to generate the first voltage signal.

11. The circuit as claimed in claim 10 further comprising:
    a plurality of impedance circuits, wherein at least one impedance circuit is in parallel connection with one of:
    at least one NMOS transistor of the pair of NMOS transistors for providing impedance against drain-to-source voltage of the at least one NMOS transistor; and
    at least one PMOS transistor of the pair of PMOS transistors for providing impedance against drain-to-source voltage of the at least one PMOS transistor.

12. The circuit as claimed in claim 1 further comprising:
    a preset helper circuit coupled to drains of the first pair of cross-coupled PMOS transistors to generate desired voltages at the drains, the preset helper circuit comprising:
    another instance of the pair of NMOS transistors; and
    another instance of the n-type cascode stage
    the another instance of the pair of NMOS transistors in conjunction with the another instance of the n-type cascode stage generating the desired voltages in response to a pair of preset voltage signals and the third voltage signal.

13. The circuit as claimed in claim 1 further comprising:
    a preset helper circuit coupled to sources of the pair of PMOS transistors to generate desired voltages at the sources, the preset helper circuit comprising another instance of the n-type cascode stage, the another instance of the n-type cascode stage generating the desired voltages in response to a pair of preset voltage signals and the third voltage signal.

14. A circuit for generating tri-state input, the circuit comprising:
    a first p-type metal oxide semiconductor (PMOS) transistor having a source coupled to an input voltage supply terminal;
    a second PMOS transistor having a source coupled to the input voltage supply terminal, a gate coupled to a drain of the first PMOS transistor and a drain coupled to a gate of the first PMOS transistor;

a third PMOS transistor having a source coupled to the input voltage supply terminal and a gate coupled to a drain of the second PMOS transistor;

a first branch defining a first output terminal and coupled to the drain of the first PMOS transistor;

a second branch defining a second output terminal and coupled to the drain of the second PMOS transistor;

a third branch defining a third output terminal and coupled to the drain of the third PMOS transistor;

each branch comprising:

a first n-type metal oxide semiconductor (NMOS) transistor receiving a voltage signal;

a circuit of first type coupled between the first NMOS transistor and corresponding output terminal to enable generation of an output at the corresponding output terminal;

a circuit of second type coupled between the corresponding output terminal and the drain of corresponding PMOS transistor to enable generation of the output at the corresponding output terminal in conjunction with the first NMOS transistor, the circuit of first type and the corresponding PMOS transistor, the first branch generating one of 0 volts and a voltage equivalent to that at the input voltage supply terminal, the second branch generating one of 0 volts and the voltage equivalent to that at the input voltage supply terminal, and the third branch generating one of 0 volts, a high impedance state and the voltage equivalent to that at the input voltage supply terminal based on the voltage signal received by the NMOS transistor of each branch, wherein generating the voltage equivalent to that at the input voltage supply terminal comprises voltage switching; and wherein the third branch is independently controlled for generating the one of 0 volts, the high impedance state and the voltage equivalent to that at the input voltage supply terminal based on the voltage signal received by the circuit of first type of the third branch.

15. The circuit as claimed in claim 14, wherein the circuit of first type comprises:

a first circuit coupled to a second NMOS transistor and the first NMOS transistor, the first circuit responsive to two inputs to output a maximum of the two inputs, wherein the first circuit comprises a first pair of cross-coupled PMOS transistors; and a second circuit coupled to a third NMOS transistor and the second NMOS transistor, the second circuit responsive to two inputs to output a maximum of the two inputs wherein the second circuit comprises a second pair of cross-coupled PMOS transistors.

16. The circuit as claimed in claim 14, wherein the circuit of second type comprises:

a third circuit coupled to a fourth PMOS transistor and a fifth PMOS transistor, the third circuit responsive to two inputs to output a minimum of the two inputs, wherein the third circuit comprises a first pair of cross-coupled NMOS transistors; and a fourth circuit coupled to a sixth PMOS transistor, a fifth PMOS transistor and the third circuit, the fourth circuit responsive to two inputs to output a minimum of the two inputs, wherein the fourth circuit comprises a second pair of cross-coupled NMOS transistors.

17. A method, for use with a circuit comprising first and second output terminals, for switching voltage at the first and second output terminals of the circuit, the method comprising:

propagating a first voltage signal to the first and second output terminals through an n-type cascode stage in response to receipt of the first voltage signal by the n-type cascode stage in preset mode, the n-type cascode stage being coupled between the first and second output terminals and a pair of terminals through which a first voltage signal is applied to the n-type cascode stage, the n-type cascode stage enabling propagation of the first voltage signal to the first and second output terminals in the preset mode;

propagating the first voltage signal from the first and second output terminals to the input voltage supply terminal through p-type cascode stage coupled to the first and second output terminals to enable propagation of the first voltage signal to an input voltage supply terminal of the circuit, a pair of cross-coupled transistors coupled to the input voltage supply terminal and responsive to voltage switching at the input voltage supply terminal to generate voltage switching at the first and second output terminals in a latched mode, and a pair of transistors, coupled between the pair of cross-coupled transistors and the p-type cascode stage;

inactivating a first one of the first pair of cross-coupled transistors responsive to the first voltage signal and activating a second one of the pair of cross-coupled transistors in the preset mode to enable propagation of the first voltage signal to the input voltage supply terminal;

enabling propagation of the voltage switching at the input voltage supply terminal to the first and second output terminals in the latched mode in conjunction with the p-type cascode stage, responsive to the voltage switching at the input voltage supply terminal and a fourth voltage signal; and coupling voltage at the input voltage supply terminal to the first and second output terminals in the latched mode through the p-type cascode stage, the pair of transistors and the pair of cross-coupled transistors.

18. The method as claimed in claim 17, wherein propagating the first voltage signal to the first and second output terminals comprises:

outputting maximum voltage value of two inputs by a first circuit coupled between the first and second output terminals and voltage supply terminals.

19. The method as claimed in claim 17, wherein the coupling voltage at the input voltage supply terminal to the first and second output terminals comprises:

outputting minimum voltage value of two inputs by a first circuit coupled between the input voltage supply terminal and the first and second output terminals.

20. The method as claimed in claim 17, wherein:

respective transistors of the pair of cross-coupled transistors have respective sources; and the method further comprises:

propagating preset voltage signals to the pair of cross-coupled transistors in response to the preset voltage signals received by a preset helper circuit in the preset mode to generate desired voltages at the respective sources of the pair of cross-coupled transistors.

21. A semiconductor memory circuit comprising:

circuitry for programming and erasing information, having an input for receiving switching voltage;

voltage switching circuitry having outputs coupled to the input of the circuitry for programming and erasing information, for driving the circuitry for programming and erasing information by selectively applying voltages thereto, the voltage switching circuitry being operable in a latched mode and in a preset mode, and comprising:
- circuitry, including a pair of cross-coupled transistors, for storing voltage values of a switch state of the outputs of the voltage switching circuitry;
- a first cascode stage, coupled between the circuitry for storing voltage values of the switch state and the outputs of the voltage switching circuitry, for reducing electrical stress on individual transistors of the voltage switching circuitry;
- a second cascode stage coupled to the outputs of the voltage switching circuitry, for reducing electrical stress on individual transistors of the voltage switching circuitry; and
- circuitry, including a pair of transistors, for receiving voltage signals from first, second and third voltage signals supply terminals, and coupling the received voltage signals through the second cascode stage to the outputs of the voltage switching circuitry;

wherein the voltage switching circuitry provides a voltage range to the outputs of the voltage switching circuitry, the voltage range being related to the number of cascode stages and to a property of the transistors.

22. The semiconductor memory circuit as claimed in claim 21, wherein:
- the first cascode stage comprises a p-type cascode stage; and
- the second cascode stage comprises an n-type cascode stage.

23. The semiconductor memory circuit as claimed in claim 21, further comprising one of:
- a third cascode stage, coupled between the circuitry for storing voltage values of the switch state and the first cascode stage; and
- a fourth cascode stage, coupled between the second cascode stage and the circuitry for receiving and coupling the first, second and third voltage signals.

24. The semiconductor memory circuit as claimed in claim 21, wherein the first and second cascode stages each include a pair of circuits, each one of the pair of circuits comprised in the first and second cascode stages having a pair of cross-coupled transistors.

* * * * *